United States Patent
Song

(10) Patent No.: US 8,115,221 B2
(45) Date of Patent: Feb. 14, 2012

(54) SINGLE CRYSTAL NITRIDE SEMICONDUCTOR MATERIAL ON CONDUCTIVE SUBSTRATE USING SUBSTRATE DECOMPOSITION PREVENTION LAYER FOR NITRIDE LIGHT EMITTING DEVICE

(75) Inventor: June O Song, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 512 days.

(21) Appl. No.: 11/997,530

(22) PCT Filed: Jul. 31, 2006

(86) PCT No.: PCT/KR2006/003004
§ 371 (c)(1),
(2), (4) Date: Jan. 31, 2008

(87) PCT Pub. No.: WO2007/015613
PCT Pub. Date: Feb. 8, 2007

(65) Prior Publication Data
US 2009/0309118 A1 Dec. 17, 2009

(30) Foreign Application Priority Data
Jul. 31, 2005 (KR) .................. 10-2005-0070087

(51) Int. Cl.
*H01L 27/15* (2006.01)
(52) U.S. Cl. ............. 257/98; 257/79; 257/13; 257/99; 257/94; 257/96; 257/103
(58) Field of Classification Search ............. 257/98, 257/99
See application file for complete search history.

(56) References Cited

U.S. PATENT DOCUMENTS

| 5,506,451 A * | 4/1996 | Hyugaji ................. 257/778 |
| 6,583,443 B1 * | 6/2003 | Chang et al. ............ 257/79 |
| 6,602,764 B2 * | 8/2003 | Linthicum et al. ........ 438/481 |
| 6,610,551 B1 * | 8/2003 | Doverspike et al. ....... 438/22 |
| 6,838,704 B2 * | 1/2005 | Lin et al. ............... 257/98 |

(Continued)

FOREIGN PATENT DOCUMENTS
JP 2001007396 12/2001
(Continued)

OTHER PUBLICATIONS
Machine translation of KR 10-2005-0081208 has been attached.*
(Continued)

*Primary Examiner* — Wai Sing Louie
*Assistant Examiner* — Bilkis Jahan
(74) *Attorney, Agent, or Firm* — Cantor Colburn LLP

(57) ABSTRACT

A light-emitting device is provided with a substrate decomposition prevention layer using as a matrix at least one selected from the group consisting of boron nitride (B—N), silicon carbide (Si—C), and silicon carbon nitride (Si—C—N), and patterned into a predetermined shape; an n-type nitride clad layer formed on the substrate decomposition prevention layer; a nitride active layer formed on the n-type nitride clad layer; a p-type nitride clad layer formed on the nitride active layer; a p-type ohmic contact layer formed on the p-type nitride clad layer; a p-type electrode pad formed on the p-type ohmic contact layer; an n-type ohmic contact layer electrically connected to the n-type nitride clad layer by means of a patterned region of the substrate decomposition prevention layer; and an n-type electrode pad formed beneath the n-type ohmic contact layer.

16 Claims, 12 Drawing Sheets

U.S. PATENT DOCUMENTS

| | | |
|---|---|---|
| 6,979,582 B2 * | 12/2005 | Horng et al. ..................... 438/27 |
| 2001/0042866 A1 * | 11/2001 | Coman et al. .................. 257/103 |
| 2004/0218259 A1 * | 11/2004 | Hui et al. ....................... 359/344 |
| 2005/0205941 A1 * | 9/2005 | Tanimoto ....................... 257/378 |

FOREIGN PATENT DOCUMENTS

| | | |
|---|---|---|
| JP | 2004140008 | 5/2004 |
| KR | 1020050013046 | 2/2005 |
| KR | 1020050014345 | 2/2005 |
| KR | 1020050068401 | 7/2005 |
| KR | 10-2005-0081208 * | 8/2005 |
| KR | 1020050081208 | 8/2005 |
| WO | 0237579 | 5/2002 |

OTHER PUBLICATIONS

International Search Report for PCT/KR2006/003004; mail date of Oct. 26, 2006.

Written Opinion of the International Searching Authority for PCT/KR2006/003004;mail date of Oct. 26, 2006.

* cited by examiner

SINGLE CRYSTAL NITRIDE SEMICONDUCTOR MATERIAL ON CONDUCTIVE SUBSTRATE USING SUBSTRATE DECOMPOSITION PREVENTION LAYER FOR NITRIDE LIGHT EMITTING DEVICE

TECHNICAL FIELD

The present invention relates to a growth of a single crystal nitride semiconductor material on a conductive substrate, and a method for manufacturing a high-quality nitride light-emitting device.

BACKGROUND ART

Recently, a single crystal nitride semiconductor has been considered to be one of the most important materials in the optics-related industry field due to many attempts to develop photoelectronic devices such as light emitting diodes (LED) spanning from blue/green to (near) ultraviolet rays, laser diodes, and photosensors, and due to rapid technical progress of the photoelectronic devices. First of all, practical photoelectronic devices including a nitride semiconductor are mainly grown on a dielectric sapphire substrate and conductive silicon carbide (Si—C) at a high temperature of 1200 degrees Celsius or above under a hydrogen ambient using ammonia ($NH_3$) and hydrogen ($H_2$) as a carrier gas. However, dielectric sapphire and conductive silicon carbide substrates are much more expensive than silicon (Si) materials, and therefore their effectiveness is lowered in terms of economics. In addition, the nitride photoelectronic devices manufactured on the dielectric sapphire substrate should smoothly discharge heat since much heat is generated during their operation, but sapphire has a crucial drawback in that it has a significantly poor thermal conductivity.

In addition to the dielectric sapphire and silicon carbide substrates, transparent conductive zinc oxide (ZnO) has been in the spotlight as a substrate for next-generation nitride light-emitting devices due to its lattice constant with a nitride semiconductor, good electrical and thermal conductivity, excellent light transmittance, and low cost. However, these transparent conductive zinc oxides (ZnO-based oxides) are easily decomposed since a substrate surface made therefrom is decisively unstable at a high temperature of 600 degrees Celsius or above under a high vacuum of $10^{-3}$ Torr or more, and it is also nearly impossible to allow a single crystal nitride semiconductor to grow at a high temperature of 800 degrees Celsius or above under a reducing ambient such as hydrogen ($H_2$) or ammonia ($NH_3$) since the conductive zinc oxides are more actively reduced under the reducing ambient.

As other conductive substrates, silicon (Si), silicon germanium (SiGe), and gallium arsenide (GaAs) have been in the spotlight. The conductive substrates are deformed/decomposed at a high temperature of 500 degrees Celsius or above due to motion of a dislocation slip system present in their substrate, and it is also difficult to allow a superior nitride thin film to grow due to a large lattice constant with a nitride semiconductor and a large thermal expansion coefficient.

DISCLOSURE

Technical Problem

Accordingly, the present invention is designed to solve such drawbacks of the prior art, and therefore the technical subject of the present invention is to provide growth of a superior single crystal nitride semiconductor material by introducing a thin film onto a conductive substrate such as transparent conductive zinc oxide (ZnO), silicon (Si), silicon germanium (SiGe), and gallium arsenide (GaAs) for the purpose of preventing deformation and decomposition of the substrate at a high temperature/a hydrogen ambient, the thin film being a substrate decomposition prevention layer (SDPL) including boron nitride (B—N), silicon carbide (Si—C), or silicon carbon nitride (Si—C—N) as a matrix, and a method for manufacturing a high-quality nitride light-emitting device using the same.

Technical Solution

According to an exemplary embodiment of the present invention, a light-emitting device is provided, that includes: a substrate decomposition prevention layer using at least one selected from the group consisting of boron nitride (B—N), silicon carbide (Si—C), and silicon carbon nitride (Si—C—N) as a matrix, and that is patterned into a predetermined shape; an n-type nitride clad layer formed on the substrate decomposition prevention layer; a nitride active layer formed on the n-type nitride clad layer; a p-type nitride clad layer formed on the nitride active layer; a p-type ohmic contact layer formed on the p-type nitride clad layer; a p-type electrode pad formed on the p-type ohmic contact layer; an n-type ohmic contact layer electrically connected to the n-type nitride clad layer by means of a patterned region of the substrate decomposition prevention layer; and an n-type electrode pad formed beneath the n-type ohmic contact layer.

The light-emitting device may further include a nitride buffer layer formed between the substrate decomposition prevention layer and the n-type nitride clad layer.

The p-type ohmic contact layer may include at least one selected from the group consisting of transparent conductive oxides using ITO, ZnO, $SnO_2$, and $In_2O_3$ as a matrix, conductive transitional metal nitrides including TiN, and oxidized nickel-gold (Ni—Au) and silver (Ag), and the p-type electrode pad may be composed of a bi-layer of nickel (Ni) and gold (Au) or a bi-layer of silver (Ag) and gold (Au).

The n-type ohmic contact layer may be composed of a bi-layer of aluminum and titanium (Al/Ti), and the n-type electrode pad may include at least one selected from the group consisting of aluminum (Al), silver (Ag), and rhodium (Rh).

The n-type ohmic contact layer may include at least one selected from the group consisting of transparent conductive oxides using ITO, ZnO, $SnO_2$, and $In_2O_3$ as a matrix, conductive transitional metal nitrides including TiN, and oxidized nickel-gold (Ni—Au) and silver (Ag), and the n-type electrode pad may be composed of a bi-layer of nickel (Ni) and gold (Au) or a bi-layer of silver (Ag) and gold (Au).

The p-type ohmic contact layer may be composed of a bi-layer of aluminum and titanium (Al/Ti), and the p-type electrode pad may include at least one selected from the group consisting of aluminum (Al), silver (Ag), and rhodium (Rh).

The substrate decomposition prevention layer may include at least one additive selected from the group consisting of oxides or nitrogen oxides of elements including silicon (Si), germanium (Ge), indium (In), lithium (Li), gallium (Ga), magnesium (Mg), zinc (Zn), beryllium (Be), molybdenum (Mo), vanadium (V) copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La), an amount of the additive in the substrate decomposition prevention layer may range from 0.1 wt % to 49 wt %, and the substrate decomposition prevention layer has a thickness of 3 nanometers to 10 micrometers.

The substrate decomposition prevention layer may include a bi-layer of a lower layer and an upper layer, the lower layer including boron nitride (B—N), silicon carbide (Si—C), or silicon carbon nitride (Si—C—N) as a matrix, and the upper layer being composed of silicon carbide (Si—C).

According to another exemplary embodiment of the present invention, a light-emitting device including a supporting substrate, a p-type ohmic contact layer formed on the supporting substrate and that reflects light, a p-type nitride clad layer formed on the p-type ohmic contact layer, a nitride active layer formed on the p-type nitride clad layer, an n-type nitride clad layer formed on the nitride active layer, a transparent n-type ohmic contact layer formed on the n-type nitride clad layer, and an n-type electrode pad formed on the n-type ohmic contact layer is provided.

The n-type ohmic contact layer may include at least one selected from the group consisting of transparent conductive oxides using ITO, ZnO, $SnO_2$, and $In_2O_3$ as a matrix, conductive transitional metal nitrides including TiN, and oxidized nickel-gold (Ni—Au) and silver (Ag), and the n-type electrode pad may be composed of a bi-layer of nickel (Ni) and gold (Au) or a bi-layer of silver (Ag) and gold (Au).

The n-type ohmic contact layer may be composed of a bi-layer of aluminum and titanium (Al/Ti).

According to further another exemplary embodiment of the present invention, a method for manufacturing a light-emitting device includes: forming a substrate decomposition prevention layer on the first substrate; forming an n-type nitride clad layer, a nitride active layer, and a p-type nitride clad layer on the substrate decomposition prevention layer; attaching a second substrate onto the p-type nitride clad; removing the first supporting substrate by means of an etching process; patterning the substrate decomposition prevention layer; forming an n-type ohmic contact layer to be electrically connected to the n-type clad layer by means of a patterned region of the substrate decomposition prevention layer; forming an n-type electrode pad on the n-type ohmic contact layer; removing the second substrate; forming a p-type ohmic contact layer on the p-type nitride clad layer; and forming a p-type electrode pad on the p-type ohmic contact layer. The substrate decomposition prevention layer uses at least one selected from the group consisting of boron nitride (B—N), silicon carbide (Si—C), and silicon carbon nitride (Si—C—N) as a matrix.

The first substrate may have a zinc oxide layer formed on at least one selected from the group consisting of transparent conductive zinc oxide (ZnO) substrates, or silicon (Si), silicon germanium (SiGe), gallium arsenide (GaAs), and sapphire substrates.

The method for manufacturing a light-emitting device of the present invention may further include forming a nitride buffer layer on the substrate decomposition prevention layer in the previous step of forming the n-type nitride clad layer on the substrate decomposition prevention layer.

The substrate decomposition prevention layer may be formed using at least one selected from the group consisting of CVD (Chemical Vapor Deposition) including metalorganic chemical vapor deposition (MOCVD), thermal or E-beam evaporation, laser deposition, sputtering deposition using gas ions such as oxygen ($O_2$), nitrogen ($N_2$), and argon (Ar), and co-sputtering deposition using at least two sputtering guns.

The substrate decomposition prevention layer may be deposited in a temperature range of room temperature to 1200 degrees Celsius; the substrate decomposition prevention layer may include at least one additive selected from the group consisting of oxides or nitrogen oxides of elements including silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La); and the substrate decomposition prevention layer includes a bi-layer of a lower layer and an upper layer, the lower layer including boron nitride (B—N), silicon carbide (Si—C), or silicon carbon nitride (Si—C—N) as a matrix, and the upper layer being composed of silicon carbide (Si—C).

The p-type ohmic contact layer may include at least one selected from the group consisting of transparent conductive oxides using ITO, ZnO, $SnO_2$, and $In_2O_3$ as a matrix, conductive transitional metal nitrides including TiN, and oxidized nickel-gold (Ni—Au) and silver (Ag); the p-type electrode pad is formed of a bi-layer of nickel (Ni) and gold (Au) or a bi-layer of silver (Ag) and gold (Au); the n-type ohmic contact layer is formed of a bi-layer of aluminum and titanium (Al/Ti); and the n-type electrode pad includes at least one selected from the group consisting of aluminum (Al), silver (Ag), and rhodium (Rh).

The n-type ohmic contact layer includes at least one selected from the group consisting of transparent conductive oxides using ITO, ZnO, $SnO_2$, and $In_2O_3$ as a matrix, conductive transitional metal nitrides including TiN, and oxidized nickel-gold (Ni—Au) and silver (Ag); the second electrode pad is formed of a bi-layer of nickel (Ni) and gold (Au) or a bi-layer of silver (Ag) and gold (Au); the p-type ohmic contact layer is formed of a bi-layer of aluminum, and titanium (Al/Ti); and the first electrode pad includes at least one selected from the group consisting of aluminum (Al), silver (Ag), and rhodium (Rh).

The method for manufacturing a light-emitting device of the present invention may further include heat-treating the first substrate and the substrate decomposition prevention layer in a temperature range of room temperature to 1200 degrees Celsius or above for 10 seconds to 3 hours in the previous step of forming the buffer layer, and the heat treatment may be carried out under a gas ambient including at least one selected from the group consisting of nitrogen, argon, helium, oxygen, hydrogen, air, and vacuum.

According to still another exemplary embodiment of the present invention, a method for manufacturing a light-emitting device includes: forming a substrate decomposition prevention layer on a first substrate, the substrate decomposition prevention layer using at least one selected from the group consisting of boron nitride (B—N), silicon carbide (Si—C), and silicon carbon nitride (Si—C—N) as a matrix; forming an n-type nitride clad layer, a nitride active layer, and a p-type nitride clad layer on the substrate decomposition prevention layer; forming a p-type ohmic contact layer on the p-type clad layer; attaching a conductive second substrate to the p-type ohmic contact layer; removing the first supporting substrate and the substrate decomposition prevention layer by means of an etching process; forming a transparent n-type ohmic contact layer on the n-type nitride clad layer; and forming an n-type electrode pad on the n-type ohmic contact layer.

The first substrate may have a zinc oxide layer formed on at least one selected from the group consisting of transparent conductive zinc oxide (ZnO) substrates, or silicon (Si), silicon germanium (SiGe), gallium arsenide (GaAs), and sapphire substrates.

The method for manufacturing a light-emitting device of the present invention may further include forming a nitride buffer layer on the substrate decomposition prevention layer in the previous step of forming the n-type nitride clad layer on the substrate decomposition prevention layer, and removing the nitride buffer layer together in the step of removing the first supporting substrate and the substrate decomposition prevention layer by means of an etching process.

The substrate decomposition prevention layer may include at least one additive selected from the group consisting of oxides or nitrogen oxides of elements including silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La).

The substrate decomposition prevention layer may include a bi-layer of a lower layer and an upper layer, the lower layer including boron nitride (B—N), silicon carbide (Si—C), or silicon carbon nitride (Si—C—N) as a matrix, and the upper layer being composed of silicon carbide (Si—C).

MODE FOR INVENTION

Hereinafter, methods of the present invention will be described in detail referring to the accompanying drawings, the methods including a method for allowing a superior single crystal nitride semiconductor material to grow by introducing a thin film onto a conductive substrate such as transparent conductive zinc oxide (ZnO), silicon (Si), silicon germanium (SiGe), and gallium arsenide (GaAs) for the purpose of preventing deformation and decomposition of the substrate at a high temperature/a hydrogen ambient, the thin film being an SDPL according to an exemplary embodiment of the present invention including boron nitride (B—N), silicon carbide (Si—C), or silicon carbon nitride (Si—C—N) as a matrix, and a method for manufacturing a high-quality nitride light-emitting device using the same.

Figure 1:
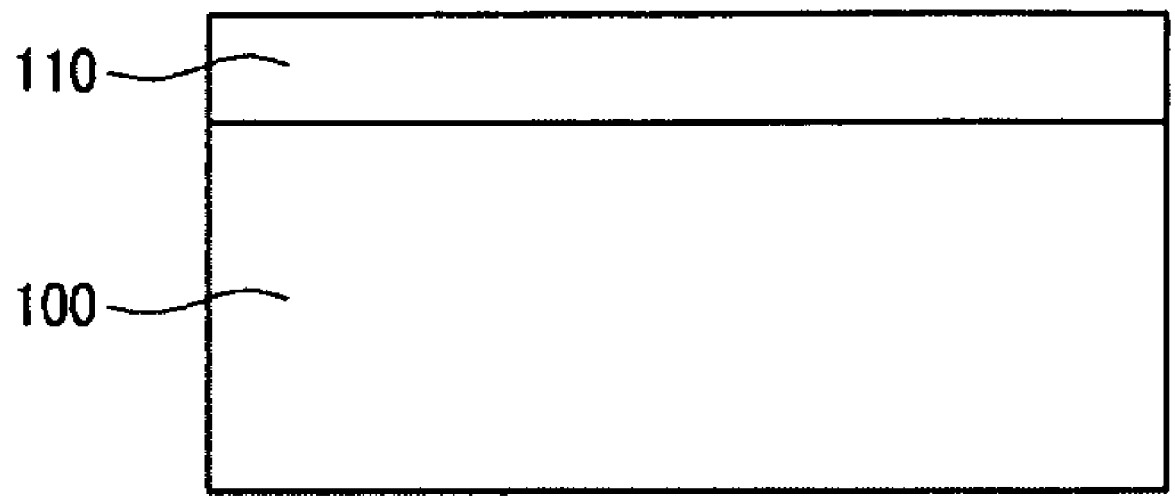
FIG. 1 is a cross-sectional view showing a configuration in which a substrate decomposition prevention layer (SDPL) 110 is formed in a single layer on a conductive and transparent zinc oxide (ZnO) substrate 100 according to an exemplary embodiment of the present invention.

FIG. 1 is a cross-sectional view showing a configuration in which an SDPL 110 is formed in a single layer on a conductive and transparent zinc oxide (ZnO) substrate 100 according to an exemplary embodiment of the present invention.

Referring to FIG. 1, an SDPL 110 composed of a single layer is formed on a substrate 100 composed of zinc oxide (ZnO) which is a transparent conductive material. The SDPL 110 is a thin film including boron nitride (B—N), silicon carbide (Si—C), or silicon carbon nitride (Si—C—N) as a matrix.

The SDPL 110 including boron nitride (B—N), silicon carbide (Si—C), or silicon carbon nitride (Si—C—N) as a matrix is the most important part in the present invention which is formed of boron nitride (B—N), silicon carbide (Si—C), or silicon carbon nitride (Si—C—N), which has thermal stability and a reductive resistance, at a high temperature of 1000 degrees Celsius or above under a hydrogen ambient using ammonia ($NH_3$) and hydrogen ($H_2$) as a carrier gas.

The SDPL 110 may control crystallinity and electron concentration of boron nitride (B—N), silicon carbide (Si—C), or silicon carbon nitride (Si—C—N), and simultaneously may maximally reduce dislocation density, which is present in a single crystal nitride semiconductor laminated onto the substrate decomposition prevention layer 110, by adding at least one component selected from the group consisting of oxides or nitrogen oxides of elements to boron nitride (B—N), silicon carbide (Si—C), or silicon carbon nitride (Si—C—N) The oxides or the nitrogen oxides of elements include silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La). In particular, the added metal oxides or nitrogen oxides are preferably uniformly dispersed in a nano-phase so as to control the dislocation density present in the single crystal nitride semiconductor.

The elements that are added to the SDPL 110 include boron nitride (B—N), silicon carbide (Si—C), or silicon carbon nitride (Si—C—N) as a matrix, and they are preferably included in an amount of 0.1 to 49 wt %.

Preferably, the SDPL 110 is formed with a thickness of 3 nanometers to 10 micrometers.

Preferably, the SDPL 110 is formed using at least one of various physical vapor depositions such as CVD (chemical vapor deposition) including metalorganic chemical vapor deposition (MOCVD), thermal or E-beam evaporation, laser deposition using a high energy, sputtering deposition using gas ions such as oxygen ($O_2$), nitrogen ($N_2$), and argon (Ar), and co-sputtering deposition using at least two sputtering guns.

More preferably, the formation of the SDPL 110 is desirably carried out in a temperature range of room temperature to 1200 degrees Celsius amongst the various processes for depositing a substrate decomposition prevention layer onto the conductive substrate using the various methods.

Figure 2:
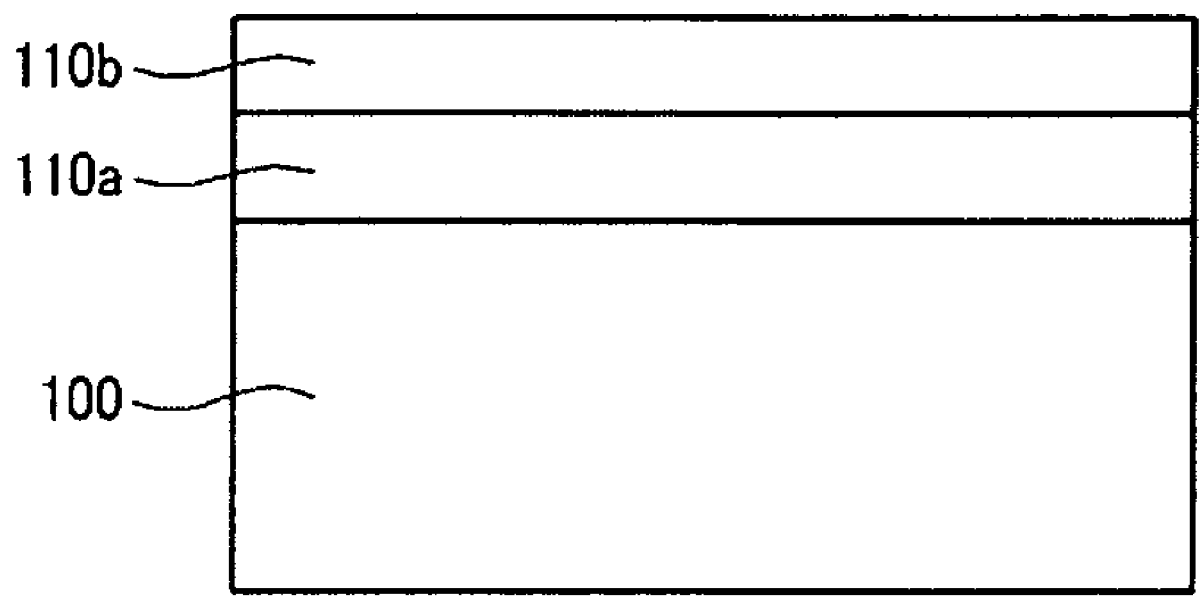
FIG. 2 is a cross-sectional view showing a configuration in which an SDPL 110 is formed in a bi-layer on a conductive and transparent zinc oxide (ZnO) substrate 100 according to another exemplary embodiment of the present invention.

FIG. 2 is a cross-sectional view showing a configuration in which an SDPL 110 is formed in a bi-layer on a conductive and transparent zinc oxide (ZnO) substrate 100 according to another exemplary embodiment of the present invention.

Referring to FIG. 2, a SDPL 110 composed of a bi-layer is formed on a transparent and conductive zinc oxide (ZnO) substrate 100. The substrate decomposition prevention layer 110 is composed of a bi-layer of a lower layer 110a and an upper layer 110b, the lower layer 110a including boron nitride (B—N), silicon carbide (Si—C), or silicon carbon nitride (Si—C—N) as a matrix, and the upper layer 110b being composed of silicon carbide (Si—C) which forms a stable single crystal at a high temperature.

The thickness, a deposition method, and processes before and after the heat treatment of the lower layer 110a are the same as in FIG. 1. A single crystal silicon carbide (SiC) thin film as the upper layer 110b is introduced to minimize crystal defects such as dislocation and the like, which are generated upon the growth of the nitride semiconductor layer due to large differences of lattice constant and thermal expansion coefficient between the lower layer 110a and the nitride semiconductor, and to prevent deformation and decomposition of a substrate, which are generated upon the growth of the nitride semiconductor layer at a high temperature and in a hydrogen ambient. Preferably, the thickness, a deposition method, and processes before and after the heat treatment of the upper layer 110b are the same as for the lower layer 110a.

Figure 3:
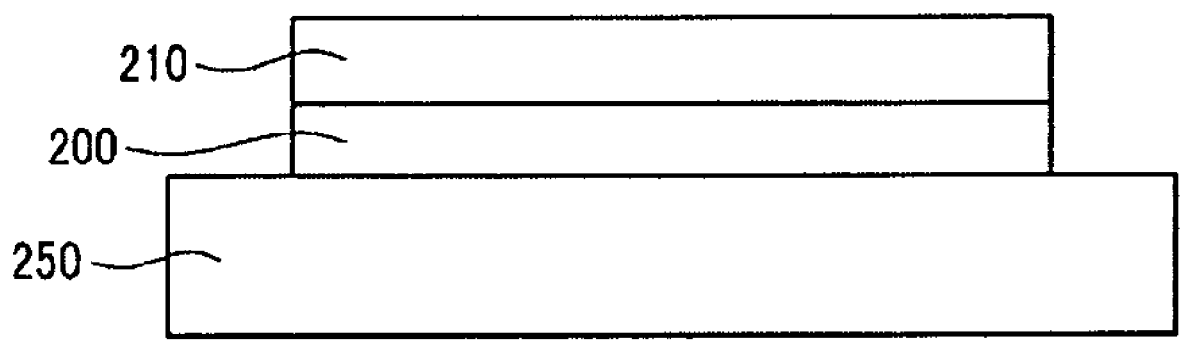
FIG. 3 is a cross-sectional view showing a configuration in which a transparent zinc oxide (ZnO) layer 200 is allowed to grow on a dielectric sapphire substrate 250 which is a base substrate, and then an SDPL 210 is formed in a sling layer on the conductive and transparent zinc oxide (ZnO) layer 200 according to another exemplary embodiment of the present invention.

FIG. 3 is a cross-sectional view showing a configuration in which a transparent zinc oxide (ZnO) layer 200 is allowed to grown on a dielectric sapphire substrate 250 which is a base substrate, and then an SDPL, 210 is formed in a sling layer on the conductive and transparent zinc oxide (ZnO) layer 200 according to another exemplary embodiment of the present invention.

Referring to FIG. 3, the transparent zinc oxide layer 200 is allowed to grow on the dielectric sapphire substrate 250, a heat treatment is carried out to facilitate surface and thermal stabilization of the grown zinc oxide, and then the same method as described in the embodiment of FIG. 1 is repeated to form the conductive substrate decomposition prevention layer 210.

Figure 4:
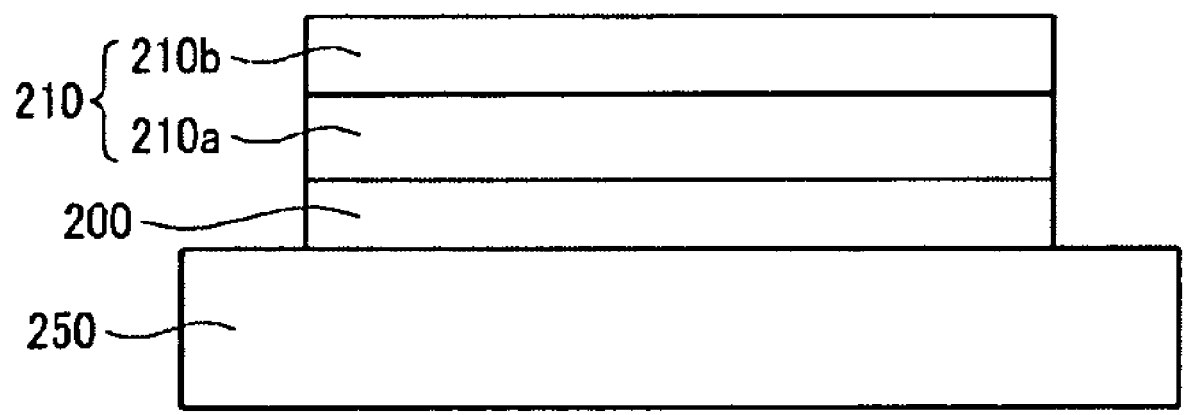
FIG. 4 is a cross-sectional view showing a configuration in which a transparent zinc oxide (ZnO) layer 200 is allowed to grow on a dielectric sapphire substrate 250 which is a base substrate, and then an SDPL 210 is formed in a bi-layer on the conductive and transparent zinc oxide (ZnO) layer 200 according to another exemplary embodiment of the present invention.

FIG. 4 is a cross-sectional view showing a configuration in which a transparent zinc oxide (ZnO) layer 200 is allowed to grow on a dielectric sapphire substrate 250 which is a base substrate, and then an SDPL 210 is formed in a bi-layer on the conductive and transparent zinc oxide (ZnO) layer 200 according to another exemplary embodiment of the present invention.

Referring to FIG. 4, the transparent zinc oxide layer 200 is allowed to grow on the dielectric sapphire substrate 250, a heat treatment is carried out to facilitate surface and thermal stabilization of the grown zinc oxide layer 200, and then a conductive substrate decomposition prevention layer 210 is formed on the zinc oxide layer 200. The substrate decomposition prevention layer 210 is composed of a bi-layer of a lower layer 210a and an upper layer 210b, the lower layer 210a including boron nitride (B—N), silicon carbide (Si—C), or silicon carbon nitride (Si—C—N) as a matrix, and the upper layer 210b being composed of silicon carbide (SiC) which forms a stable single crystal at a high temperature.

Thicknesses, a deposition method, and processes before/after the heat treatment of the lower layer 210a and the upper layer 210b are the same as described in FIG. 2.

Figure 5:
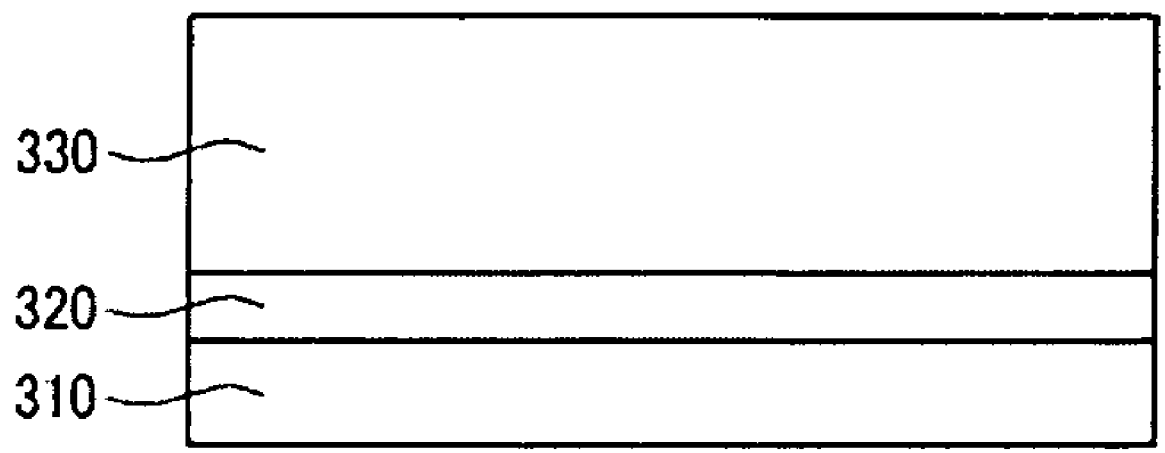
FIG. 5 is a cross-sectional view showing a configuration in which a nitride semiconductor is allowed to grow on an SDPL 310 composed of a single layer including boron nitride (B—N), silicon carbide (Si—C), or silicon carbon nitride (Si—C—N) as a matrix according to another exemplary embodiment of the present invention.

FIG. 5 is a cross-sectional view showing a configuration in which a nitride semiconductor is allowed to grow on an SDPL 310 composed of a single layer including boron nitride (B—N), silicon carbide (Si—C), or silicon carbon nitride (Si—C—N) as a matrix according to another exemplary embodiment of the present invention.

The configuration of FIG. 5 is obtained by forming a nitride buffer layer 320 and a superior single crystal nitride semiconductor layer 330 on the substrate decomposition prevention layer 310, which is the uppermost layer in the layer structure as described in the embodiments of FIG. 1 or FIG. 3, followed by simultaneously removing the conductive substrate composed of zinc oxide (ZnO) (in the case of the configuration of FIG. 1), and the dielectric sapphire substrate and the conductive zinc oxide (ZnO) layer (in the case of the configuration of FIG. 3) by means of a wet etching process using an acid or base solution or a dry etching process including at least hydrogen ($H_2$) gas. As a result, the nitride buffer layer 320 and the superior single crystal nitride semiconductor layer 330 are formed on the relatively thin SDPL 310.

Figure 6:
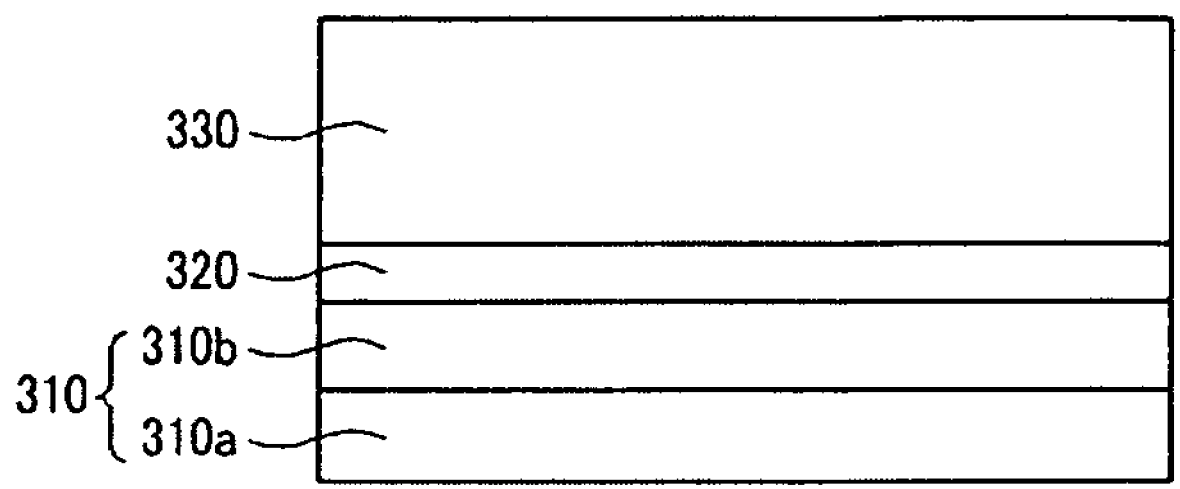
FIG. 6 is a cross-sectional view showing a configuration in which a nitride semiconductor is allowed to grow on an SDPL 310 composed of a bi-layer of a lower layer 310a and an upper layer 310b according to another exemplary embodiment of the present invention, the lower layer 310a including boron nitride (B—N), silicon carbide (Si—C), or silicon carbon nitride (Si—C—N) as a matrix, and the upper layer 310b being composed of silicon carbide (Si—C).

FIG. 6 is a cross-sectional view showing a configuration in which a nitride semiconductor is allowed to grow on an SDPL 310 composed of a bi-layer of a lower layer 310a and upper layer 310b according to another exemplary embodiment of the present invention, the lower layer 310a including boron nitride (B—N), silicon carbide (Si—C), or silicon carbon nitride (Si—C—N) as a matrix, and the upper layer 310b being composed of silicon carbide (SiC).

The configuration of FIG. 6 is obtained by forming a nitride buffer layer 320 and a superior single crystal nitride semiconductor layer 330 on the substrate decomposition prevention layer 310 which is the uppermost layer in the layer structure and includes bi-layers 310a and 310b as described in the embodiments of FIG. 1 or FIG. 3, followed by simultaneously removing the conductive substrate composed of zinc oxide (ZnO) (in the case of the configuration of FIG. 1), and the dielectric sapphire substrate and the conductive zinc oxide (ZnO) layer (in the case of the configuration of FIG. 3) by means of a wet etching process using an acid or base solution or a dry etching process including at least hydrogen ($H_2$) gas. As a result, the nitride buffer layer 320 and the superior single crystal nitride semiconductor layer 330 are formed on the relatively thin SDPL 310.

The configurations of FIG. 5 and FIG. 6, according to the embodiments of the present invention, provide a novel substrate required for the growth of the superior single crystal nitride semiconductor, and therefore the novel substrate may be used as a substrate required for the growth of the superior single crystal nitride semiconductor that is required for manufacturing a photo-detector as a non-emissive device and an electron device having high performance using a nitride semiconductor in addition to the nitride light-emitting device.

Figure 7:
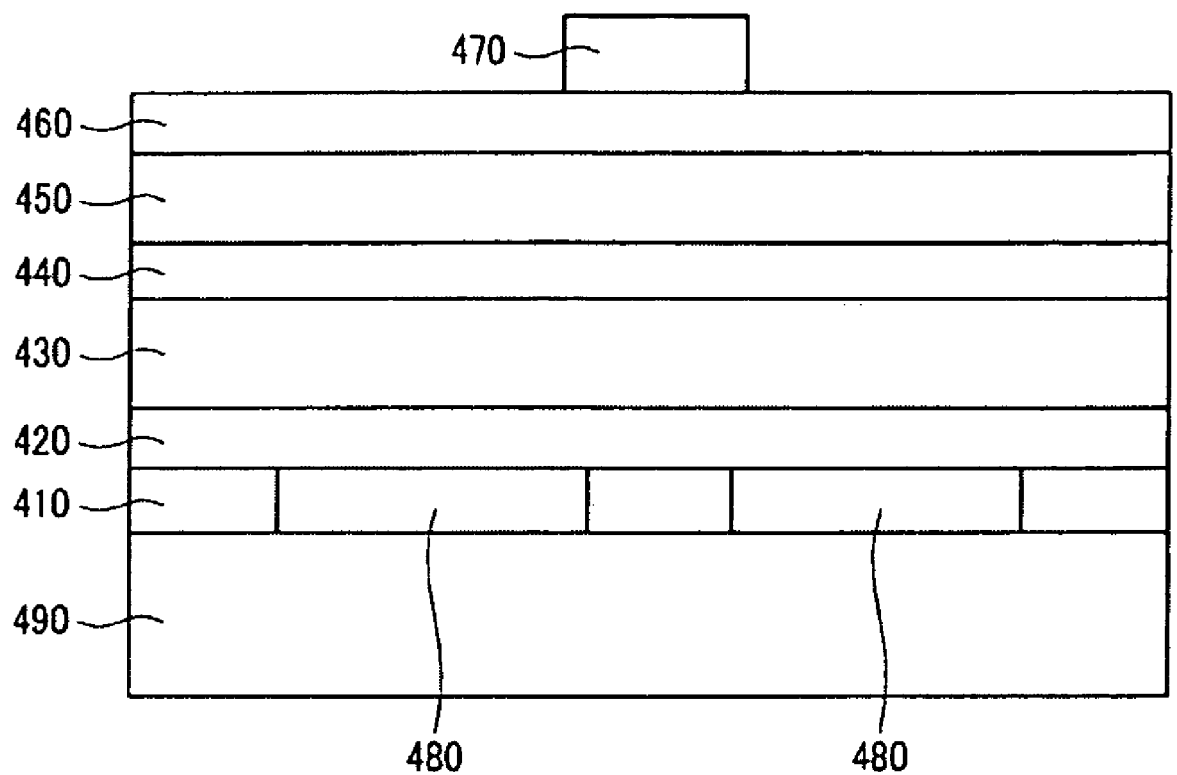
FIG. 7 is a cross-sectional view showing a vertical top-emissive nitride light-emitting device made of a thin film according to another exemplary embodiment of the present invention, the thin film being an SDPL including boron nitride (B—N), silicon carbide (Si—C), or silicon carbon nitride (Si—C—N) as a matrix.
Figure 8:
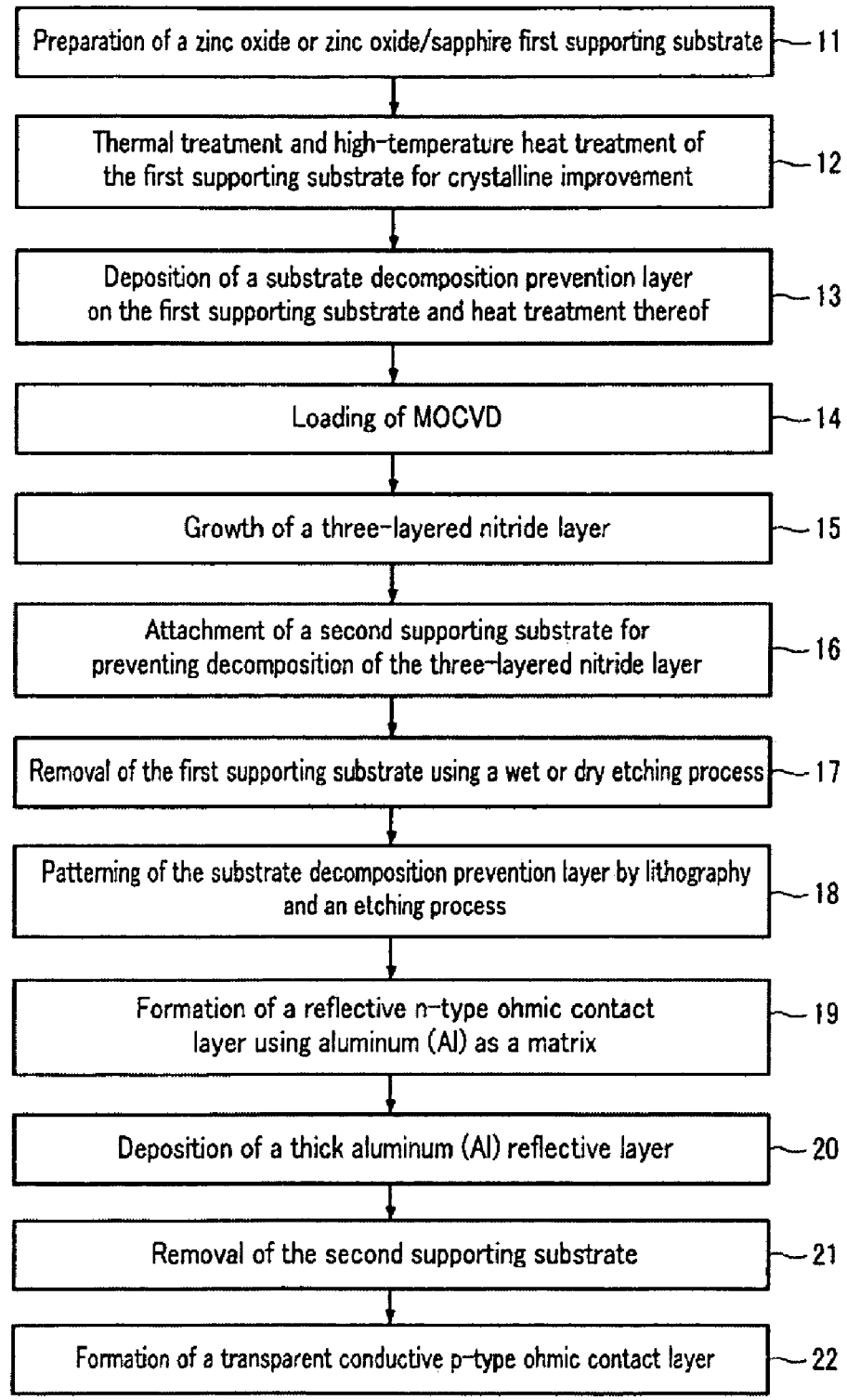
FIG. 8 is a flowchart showing a process of manufacturing the vertical top-emissive nitride light-emitting device of FIG. 7 according to another exemplary embodiment of the present invention.

FIG. 7 is a cross-sectional view showing a vertical top-emissive nitride light-emitting device made of a thin film according to another exemplary embodiment of the present invention, the thin film being an SDPL including boron nitride (B—N), silicon carbide (Si—C), or silicon carbon nitride (Si—C—N) as a matrix, and FIG. 8 is a flowchart showing a process of manufacturing the vertical top-emissive nitride light-emitting device of FIG. 7 according to another exemplary embodiment of the present invention.

Referring to FIG. 7 and FIG. 8, the method for manufacturing a vertical top-emissive nitride light-emitting device according to the embodiment of the present invention will be described in detail.

Firstly, a transparent and conductive zinc oxide (ZnO) substrate, or a dielectric sapphire substrate applied with a transparent conductive zinc oxide (ZnO) layer thereon is prepared as a first supporting substrate (Step 11), the first supporting substrate is heat treated at a high temperature to improve thermal characteristics and crystallinity (Step 12), and a substrate decomposition prevention layer 410 is formed on the first supporting substrate (Step 13).

Next, the substrate on which the substrate decomposition prevention layer 410 is formed is loaded into deposition equipment such as an MOCVD apparatus (Step 14), and a nitride buffer layer 420, an n-type nitride clad layer 430, a nitride active layer 440, and a p-type nitride clad layer 450 are sequentially laminated onto the substrate decomposition prevention layer 410 (Step 15). The layered structure of the n-type nitride clad layer 430, the nitride active layer 440, and the p-type nitride clad layer 450 is a superior nitride light-emitting structure Next, a second supporting substrate (not shown) is attached onto the p-type nitride clad layer 450 so as to prevent decomposition of a light-emitting structure during the manufacture of the nitride light-emitting device (Step 16), and then the first supporting substrate is removed by means of a wet or dry etching process (Step 17).

Next, the substrate decomposition prevention layer 410 is patterned with various gaps and sizes by means of lithography and an etching process (Step 18), a highly reflective n-type ohmic contact layer 480 using aluminum (Al) and the like as a matrix is formed to fill up a patterned region of the substrate decomposition prevention layer 410 (Step 19), and then an n-type electrode pad 490 is formed by depositing a thick metal reflective layer composed of aluminum (Al) and the like (Step 20).

As a subsequent process, the second supporting substrate attached to the p-type nitride clad layer 450 is removed (Step 21), a transparent p-type ohmic contact layer 460 is formed on the p-type nitride clad layer 450 (Step 22), and a p-type electrode pad 470 is formed on the p-type ohmic contact layer 460 to obtain a vertical top-emissive nitride light-emitting device.

The high-quality light-emitting device using the superior single crystal nitride semiconductor according to the present invention may be manufactured using various methods in addition to the above-mentioned process.

Generally, each layer spanning from the nitride buffer layer 420 to the p-type nitride clad layer 450 is basically formed of a compound selected from the group consisting of compounds represented by the formula $Al_xIn_yGa_zN$ (x, y, and z are integers) of Group III nitride compounds, and corresponding dopants are added to the n-type nitride clad layer 430 and the p-type nitride clad layer 450, respectively.

In addition, the nitride active layer 440 is composed of a single layer, or as a bi-layer represented by various known shapes having a multi quantum well (MQW) structure, for example $Al_xIn_yGa_zN/Al_xIn_yGa_zN$ (x, y, and z are integers), etc.

If a gallium nitride (GaN) compound is used as one example of configuring the nitride semiconductor light-emitting device, then the nitride buffer layer 420 is formed of GaN, the n-type nitride clad layer 430 is formed by adding an n-type dopant such as Si, Ge, Se, Te, and the like to GaN, the nitride active layer 440 is formed of InGaN/GaN MQW or AlGaN/GaN MQW, and the p-type nitride clad layer 450 is formed by adding a p-type dopant such as Mg, Zn, Ca, Sr, Ba, and the like to GaN.

A highly reflective n-type ohmic contact layer 480 may be interposed between the n-type nitride clad layer 430 and the highly reflective n-type electrode pad 490, and the highly reflective n-type ohmic contact layer 480 may have various known thickness structures such as a layer structure on which aluminum/titanium (Al/Ti) are sequentially laminated, etc. Also, thick reflective metals such as aluminum (Al), silver (Ag), and rhodium (Rh) are preferably used as materials of the highly reflective n-type electrode pad 490.

The highly transparent p-type ohmic contact layer 460 may be formed of transparent conductive oxides, which are oxide composites including ITO, ZnO, $SnO_2$, and $In_2O_3$ as a matrix; conductive transitional metal nitrides such as TiN, etc.; and favorable electrode materials for forming a known p-type ohmic contact layer such as oxidized nickel-gold (Ni—Au), silver (Ag), etc. In addition, the p-type electrode pad 470 may have a layer structure on which nickel (Ni)/gold (Au) or silver (Ag)/gold (Au) are sequentially laminated.

Each layer may be formed using known deposition methods, such as electron beam evaporation, PVD (physical vapor deposition), CVD (chemical vapor deposition), PLD (plasma laser deposition), dual-type thermal evaporation, sputtering, etc.

In the present invention, the conductive substrates made of transparent conductive oxides such as zinc oxide (ZnO), etc., include boron nitride (B—N), silicon carbide (Si—C), or silicon carbon nitride (Si—C—N), which have thermal stability and a reductive resistance at a high temperature of 1200 degrees Celsius or above under a carrier gas ambient including ammonia ($NH_3$) and hydrogen ($H_2$), as the substrate decomposition prevention layer 410 for suppressing deformation and decomposition of a substrate.

The SDPL 410 may control crystallinity and electron concentration of boron nitride (B—N), silicon carbide (Si—C), or silicon carbon nitride (Si—C—N), and simultaneously may maximally reduce dislocation density, which is present in a single crystal nitride semiconductor laminated onto the substrate decomposition prevention layer 410, by adding at least one component selected from the group consisting of oxides or nitrogen oxides of elements to boron nitride (B—N), silicon carbide (Si—C), or silicon carbon nitride (Si—CN), the oxides or the nitrogen oxides of elements including silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La). In particular, the added metal oxides or nitrogen oxides are more preferably uniformly dispersed in a nano-phase so as to control the dislocation density present in the single crystal nitride semiconductor.

In addition, the elements that are added to the thin film 410 including boron nitride (B—N), silicon carbide (Si—C), or silicon carbon nitride (Si—C—N) as a matrix are preferably added in an amount of 0.1 to 49 wt %.

Preferably, the SDPL 410 is formed with a thickness of 3 nanometers to 10 micrometers.

Preferably, the SDPL 410 is formed using at least one of various physical vapor deposition methods such as CVD (Chemical Vapor Deposition) including MOCVD; thermal or E-beam evaporation; laser deposition using a high energy; sputtering deposition using gas ions such as oxygen ($O_2$), nitrogen ($N_2$), and argon (Ar); and co-sputtering deposition using at least two sputtering guns.

More preferably, the formation of the SDPL 410 is carried out in a temperature range of room temperature to 1200 degrees Celsius amongst the various processes for depositing a substrate decomposition prevention layer onto the conductive substrate using the various methods.

Figure 9:
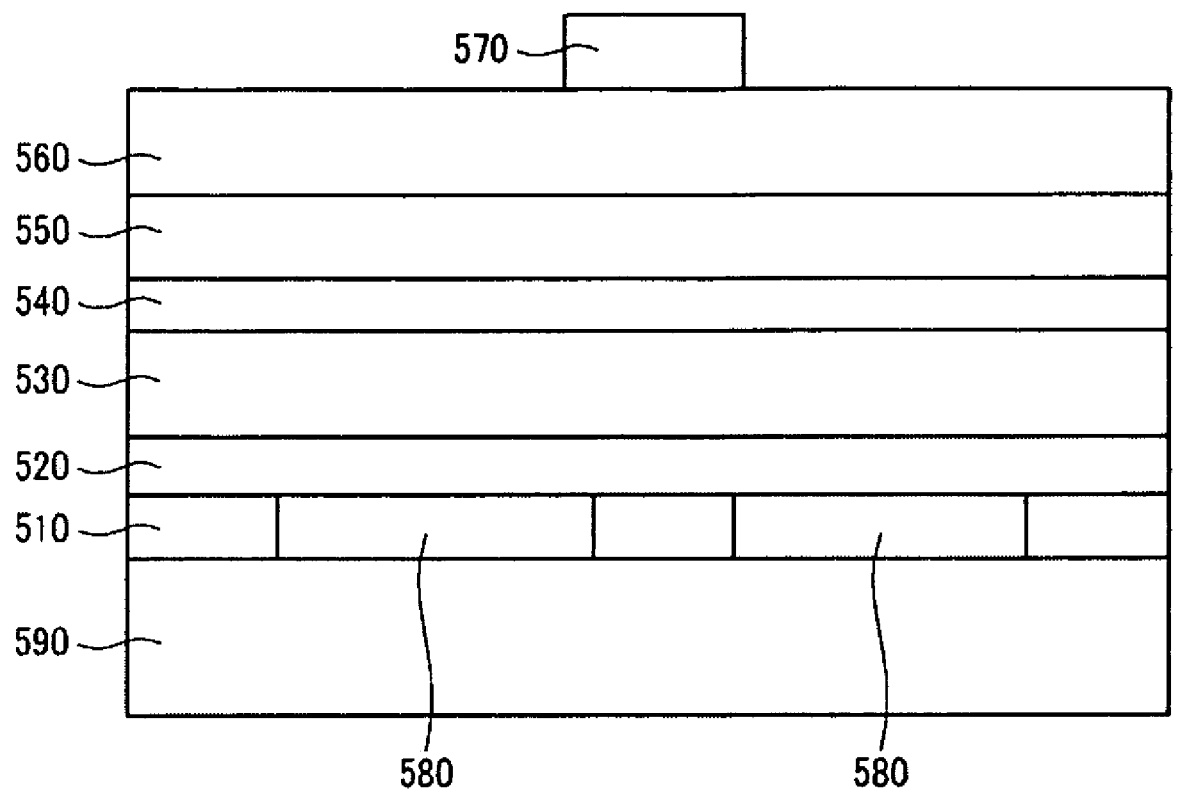
FIG. 9 is a cross-sectional view showing a vertical flip-chip emissive nitride light-emitting device made of a thin film according to another exemplary embodiment of the present invention, the thin film being an SDPL including boron nitride (B—N), silicon carbide (Si—C), or silicon carbon nitride (Si—C—N) as a matrix.
Figure 10:
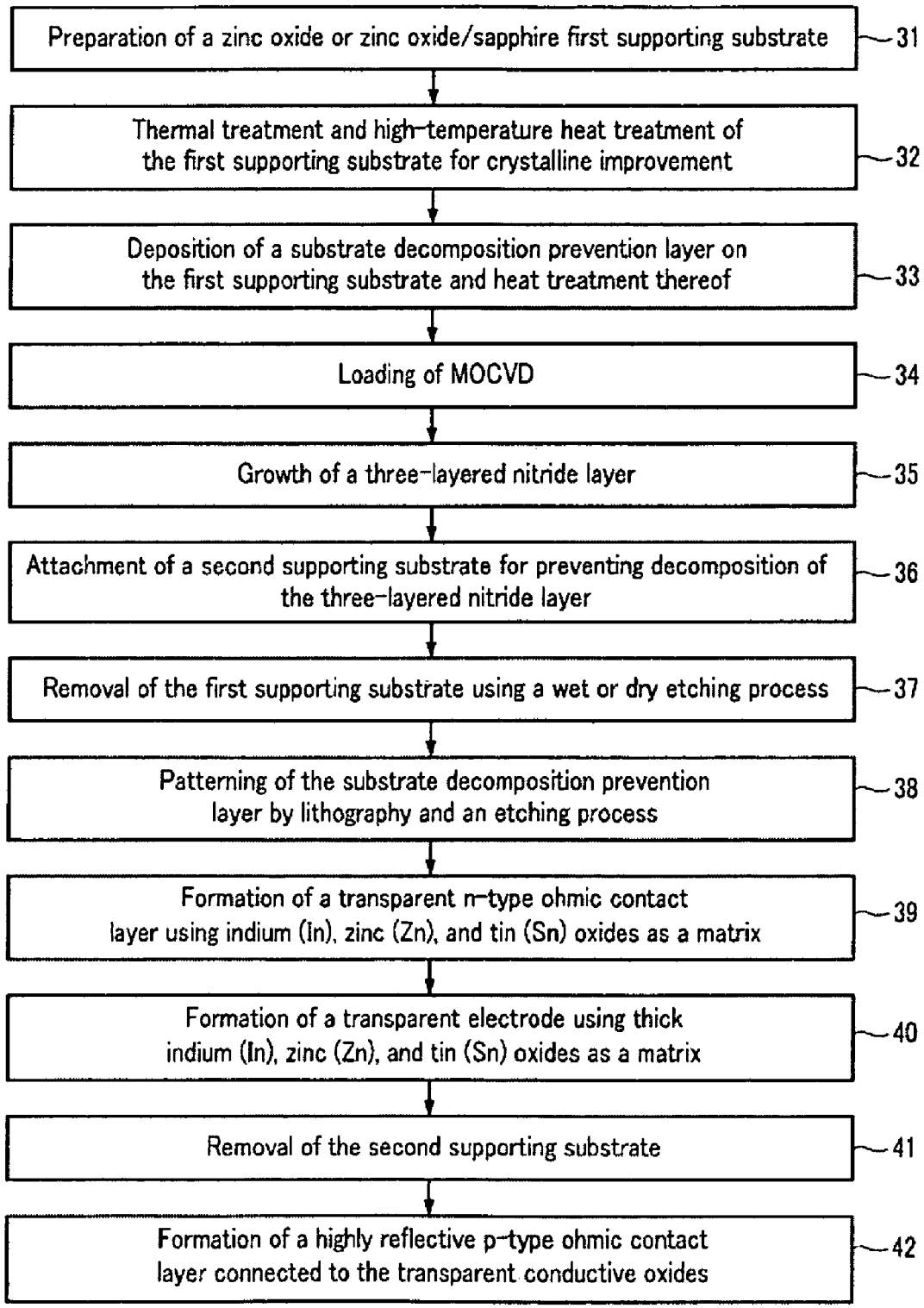
FIG. 10 is a flowchart showing a process of manufacturing the vertical flip-chip emissive nitride light-emitting device of FIG. 9 according to another exemplary embodiment of the present invention.

FIG. 9 is a cross-sectional view showing a vertical flip-chip emissive nitride light-emitting device made of a thin film according to another exemplary embodiment of the present invention, the thin film being an SDPL including boron nitride (B—N), silicon carbide (Si—C), or silicon carbon nitride (Si—C—N) as a matrix, and FIG. 10 is a flowchart showing a process of manufacturing the vertical flip-chip emissive nitride light-emitting device of FIG. 9 according to another exemplary embodiment of the present invention.

Referring to FIG. 9 and FIG. 10, the method for manufacturing a vertical flip-chip emissive nitride light-emitting device according to the embodiment of the present invention will be described in detail.

Firstly, a substrate, on which a transparent conductive zinc oxide (ZnO) layer is formed and where the substrate is a transparent and conductive zinc oxide (ZnO) substrate or a dielectric sapphire substrate, is prepared as a first supporting substrate (Step 31), the first supporting substrate is heat treated at a high temperature to improve thermal characteristics and crystallinity (Step 32), and a substrate decomposition prevention layer 510 is formed on the first supporting substrate (Step 33).

Next, the substrate on which the substrate decomposition prevention layer 510 is formed is loaded into deposition equipment such as an MOCVD apparatus (Step 34), and a nitride buffer layer 520, an n-type nitride clad layer 530, a nitride active layer 540, and a p-type nitride clad layer 550 are sequentially laminated onto the substrate decomposition prevention layer 510 (Step 35). The layered structure of the n-type nitride clad layer 530, the nitride active layer 540, and the p-type nitride clad layer 550 is a superior nitride light-emitting structure Next, a second supporting substrate (not shown) is attached onto the p-type nitride clad layer 550 so as to prevent decomposition of a light-emitting structure during the manufacture of the nitride light-emitting device (Step 36), and then the first supporting substrate is removed by means of a wet or dry etching process (Step 37).

Next, the substrate decomposition prevention layer 510 is patterned with various gaps and sizes by means of lithography and an etching process (Step 38), a highly reflective n-type ohmic contact layer 580 is formed to fill up a patterned region of the substrate decomposition prevention layer 510 (Step 39), and then a thick highly transparent electrode 590 is deposited (Step 40).

As a subsequent process, the second supporting substrate attached to the p-type nitride clad layer 550 is removed (Step 41), a highly reflective p-type ohmic contact layer 560 is formed on the p-type nitride clad layer 550 (Step 42), and a p-type electrode pad 570 is formed on the p-type ohmic contact layer 560 to obtain a vertical flip-chip nitride light-emitting device.

The high-quality light-emitting device using the superior single crystal nitride semiconductor according to the present invention may be manufactured using various methods in addition to the above-mentioned process.

Generally, each layer spanning from the nitride buffer layer 520 to the p-type nitride clad layer 550 is basically formed of a compound selected from the group consisting of compounds represented by the formula $Al_xIn_yGa_zN$ (x, y, and z are integers) of Group III nitride compounds, and corresponding dopants are added to the n-type nitride clad layer 530 and the p-type nitride clad layer 550, respectively.

Also, the nitride active layer 540 is composed of a single layer, or a bi-layer represented by various known shapes having a multi quantum well (MQW) structure, for example $Al_xIn_yGa_zN/Al_xIn_yGa_zN$ (x, y, and z are integers), etc.

If a gallium nitride (GaN) compound is used as one example of configuring the nitride semiconductor light-emitting device, then the nitride buffer layer 520 is formed of GaN, the n-type nitride clad layer 530 is formed by adding an n-type dopant such as Si, Ge, Se, Te, and the like to GaN, the nitride active layer 540 is formed of InGaN/GaN MQW or AlGaN/GaN MQW, and the p-type nitride clad layer 550 is formed by adding a p-type dopant such as Mg, Zn, Ca, Sr, Ba, and the like to GaN.

A highly transparent n-type ohmic contact layer 580 may be interposed between the n-type nitride clad layer 530 and the highly transparent n-type electrode pad 590, and the highly transparent n-type ohmic contact layer 580 may be formed of transparent conductive oxides which are oxide composites including ITO, ZnO, $SnO_2$, and $In_2O_3$ as a matrix; conductive transitional metal nitrides such as TiN, etc.; and favorable electrode materials for forming a known n-type ohmic contact layer such as conductive transitional metal nitrides including TiN, etc. Also, the transparent conductive oxides which are oxide composites including thick ITO, ZnO, $SnO_2$, and $In_2O_3$ as a matrix; conductive transitional metal nitrides such as TiN, etc.; the conductive transitional metal nitrides including TiN, etc., may be used as materials of the highly transparent n-type electrode pad 590.

The highly reflective p-type ohmic contact layer 560 may be formed of favorable electrode materials for forming a known highly reflective p-type ohmic contact layer such as silver (Ag), rhodium (Rh), aluminum (Al), etc., and also the p-type electrode pad 570 may have a layer structure on which nickel (Ni)/gold (Au) or silver (Ag)/gold (Au) are sequentially laminated.

Each layer may be formed using known deposition methods such as electron beam evaporation, PVD (physical vapor deposition), CVD (chemical vapor deposition), PLD (plasma laser deposition), dual-type thermal evaporation, sputtering, etc.

In the present invention, the conductive substrates made of transparent conductive oxides such as zinc oxide (ZnO), etc., include boron nitride (B—N), silicon carbide (Si—C), or silicon carbon nitride (Si—C—N), which have thermal stability and a reductive resistance at a high temperature of 1200 degrees Celsius or above under a carrier gas ambient including ammonia ($NH_3$) and hydrogen ($H_2$), as the substrate decomposition prevention layer 510 for suppressing deformation and decomposition of a substrate.

The SDPL 510 may control crystallinity and electron concentration of transparent and conductive boron nitride (B—N), silicon carbide (Si—C), or silicon carbon nitride (Si—C—N), and simultaneously may maximally reduce dislocation density, which is present in a single crystal nitride semiconductor laminated onto the substrate decomposition prevention layer, by adding at least one component selected from the group consisting of oxides or nitrogen oxides of elements to boron nitride (B—N), silicon carbide (Si—C), or silicon carbon nitride (Si—CN). The oxides or the nitrogen oxides of elements include silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La). In particular, the added metal oxides or nitrogen oxides are more preferably uniformly dispersed in a nano-phase so as to control the dislocation density present in the single crystal nitride semiconductor.

Also, the elements that are added to the thin film 510 including boron nitride (B—N), silicon carbide (Si—C), or silicon carbon nitride (Si—C—N) as a matrix, are preferably present in an amount of 0.1 to 49 wt %.

Preferably, the SDPL 510 is formed with a thickness of 3 nanometers to 10 micrometers.

Preferably, the SDPL 510 is formed using at least one of various physical vapor deposition methods such as CVD (Chemical Vapor Deposition) including MOCVD; thermal or E-beam evaporation; laser deposition using a high energy; sputtering deposition using gas ions such as oxygen ($O_2$), nitrogen ($N_2$), and argon (Ar); and co-sputtering deposition using at least two sputtering guns.

More preferably, the formation of the SDPL 510 is desirably carried out in a temperature range of room temperature to 1200 degrees Celsius amongst the various processes for depositing a substrate decomposition prevention layer onto the conductive substrate using the various methods.

Figure 11:
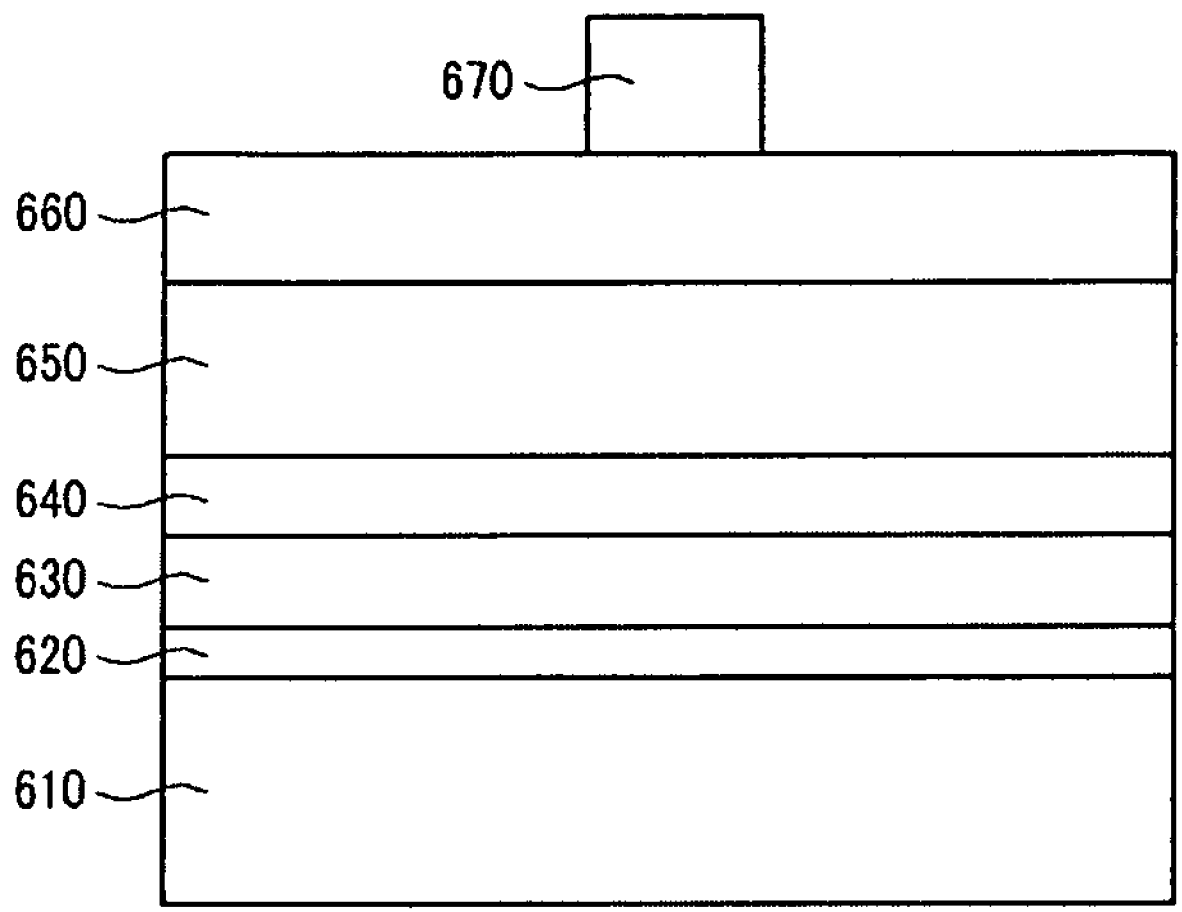
FIG. 11 is a cross-sectional view showing a vertical top-emissive nitride light-emitting device made of a thin film according to another exemplary embodiment of the present invention, the thin film being an SDPL including boron nitride (B—N), silicon carbide (Si—C), or silicon carbon nitride (Si—C—N) as a matrix.
Figure 12:
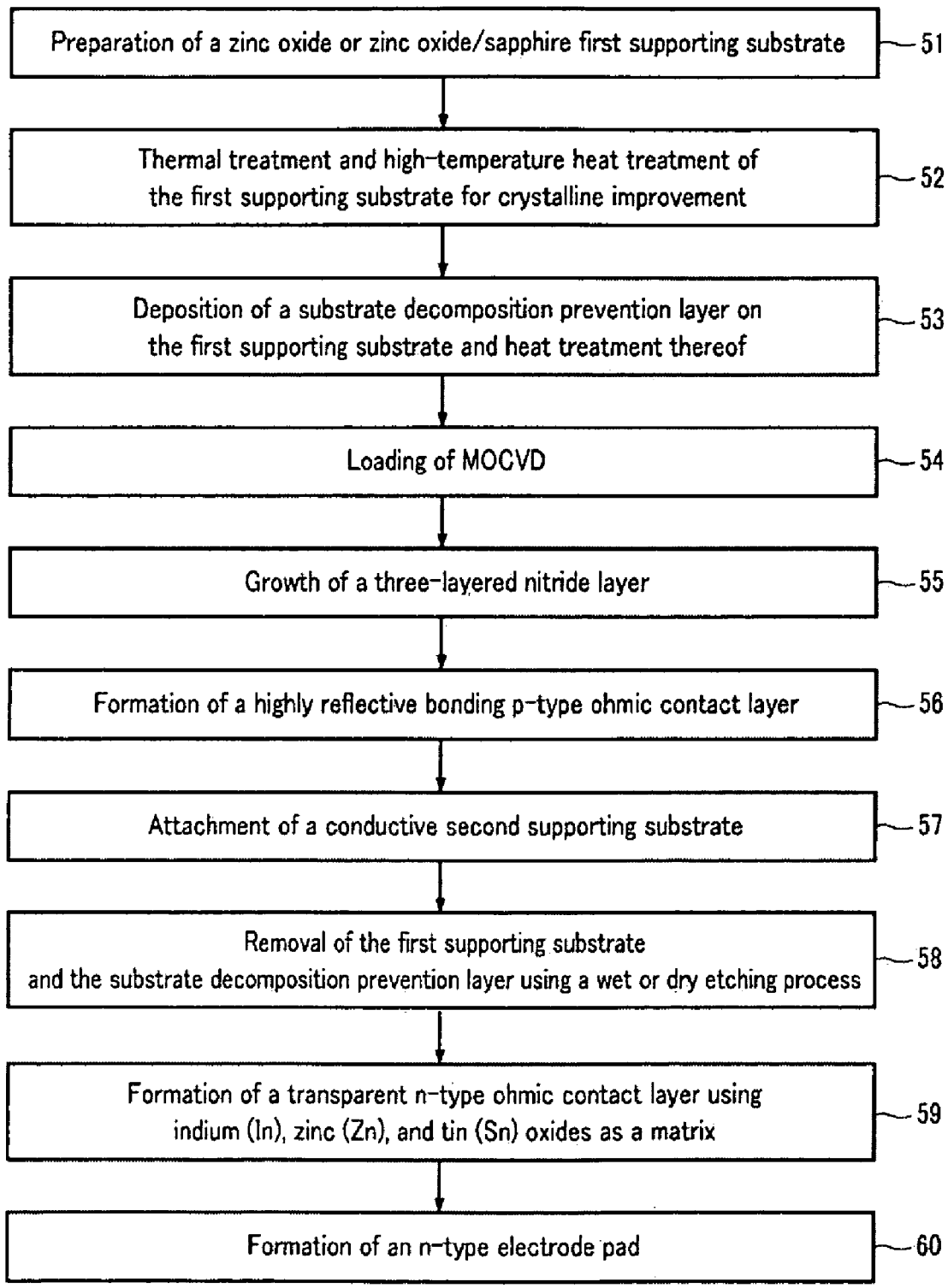
FIG. 12 is a flowchart showing a process of manufacturing the vertical top-emissive nitride light-emitting device of FIG. 11 according to another exemplary embodiment of the present invention.

FIG. 11 is a cross-sectional view showing a vertical top-emissive nitride light-emitting device made of a thin film according to another exemplary embodiment of the present invention, the thin film being an SDPL including boron nitride (B—N), silicon carbide (Si—C), or silicon carbon nitride (Si—C—N) as a matrix, and FIG. 12 is a flowchart showing a process of manufacturing the vertical top-emissive nitride light-emitting device of FIG. 11 according to another exemplary embodiment of the present invention.

Referring to FIG. 11 and FIG. 12, the method for manufacturing a vertical flip-chip emissive nitride light-emitting device according to the embodiment of the present invention will be described in detail.

Firstly, a substrate on which a transparent conductive zinc oxide (ZnO) layer is formed and where the substrate is a transparent and conductive zinc oxide (ZnO) substrate, or a dielectric sapphire substrate, is prepared as a first supporting substrate (Step 51), the first supporting substrate is heat treated at a high temperature to improve thermal characteristics and crystallinity (Step 52), and a substrate decomposition prevention layer (not shown) is formed on the first supporting substrate (Step 53).

Next, the first supporting substrate on which the substrate decomposition prevention layer is formed is loaded into deposition equipment such as an MOCVD apparatus (Step 54), and a nitride buffer layer (not shown), an n-type nitride clad layer 630 which is a superior nitride light-emitting structure, a nitride active layer 640, and a p-type nitride clad layer 650 are sequentially laminated onto the substrate decomposition prevention layer (Step 55).

Next, a highly reflective bonding p-type ohmic contact layer 620 is formed on the p-type nitride clad layer 650 (Step 56), and a conductive second supporting substrate 610 is attached onto the highly reflective bonding p-type ohmic contact layer 620 by means of a bonding material (Step 57).

After the attachment of the second supporting substrate (not shown), the first supporting substrate, the substrate decomposition prevention layer, and the buffer layer are removed by means of a wet or dry etching process (Step 58). Herein, the buffer layer may not be removed.

As a subsequent process, the highly transparent n-type ohmic contact layer 660 including indium (In), zinc (Zn), or tin (Sn) oxide as a matrix is formed on the n-type nitride clad layer 650 (Step 59), and an n-type electrode pad 670 is formed on the n-type ohmic contact layer 660 (Step 60) to obtain a vertical top-emissive nitride light-emitting device.

The high-quality light-emitting device using the superior single crystal nitride semiconductor according to the present invention may be manufactured using various methods in addition to the above-mentioned process.

Generally, each layer spanning from the nitride buffer layer to the n-type nitride clad layer 650 is formed of a compound selected from the group consisting of compounds represented by the formula $Al_xIn_yGa_zN$ (x, y, and z are integers) of Group III nitride compounds, and corresponding dopants are added to the n-type nitride clad layer 650 and the p-type nitride clad layer 630, respectively.

Also, the nitride active layer 640 is composed of a single layer, or a bi-layer represented by various known shapes having a multi quantum well (MQW) structure, for example $Al_xIn_yGa_zN/Al_xIn_yGa_zN$ (x, y, and z are integers), etc.

If a gallium nitride (GaN) compound is used as one example of configuring the nitride semiconductor light-emitting device, then the nitride buffer layer is formed of GaN, the n-type nitride clad layer 630 is formed by adding an n-type dopant such as Si, Ge, Se, Te, and the like to GaN, the nitride active layer 640 is formed of InGaN/GaN MQW or AlGaN/GaN MQW, and the p-type nitride clad layer 630 is formed by adding a p-type dopant such as Mg, Zn, Ca, Sr, Ba, and the like to GaN.

A highly transparent n-type ohmic contact layer 660 may be interposed between the n-type nitride clad layer 650 and the highly reflective n-type electrode pad 670, and the highly transparent n-type ohmic contact layer 660 may be formed of transparent conductive oxides which are oxide composites including ITO, ZnO, $SnO_2$, and $In_2O_3$ as a matrix; conductive transitional metal nitrides such as TiN, etc.; and favorable electrode materials for forming a known n-type ohmic contact layer such as conductive transitional metal nitrides including TiN, etc. In addition, the n-type electrode pad 670 may have a layer structure on which nickel (Ni)/gold (Au) or silver (Ag)/gold (Au) are sequentially laminated. The highly reflective p-type ohmic contact layer 620 may have various known thickness layer structures such as a layer structure using alloys or solid solutions including silver (Ag) and rhodium (Rh) reflective metals as a matrix, etc.

Each layer may be formed using known deposition methods such as electron beam evaporation, PVD (physical vapor deposition), CVD (chemical vapor deposition), PLD (plasma laser deposition), dual-type thermal evaporation, sputtering, etc.

In the present invention, the conductive substrates made of transparent conductive oxides such as zinc oxide (ZnO), etc., includes boron nitride (B—N), silicon carbide (Si—C), or silicon carbon nitride (Si—C—N), which have thermal stability and a reductive resistance at a high temperature of 1200 degrees Celsius or above under a carrier gas ambient including ammonia ($NH_3$) and hydrogen ($H_2$), as the substrate decomposition prevention layer for suppressing deformation and decomposition of a substrate.

The SDPL may control crystallinity and electron concentration of boron nitride (B—N), silicon carbide (Si—C), or silicon carbon nitride (Si—C—N), and simultaneously may maximally reduce dislocation density, which is present in a single crystal nitride semiconductor laminated onto the substrate decomposition prevention layer, by adding at least one component selected from the group consisting of oxides or nitrogen oxides of elements to boron nitride (B—N), silicon carbide (Si—C), or silicon carbon nitride (Si—CN). The oxides or the nitrogen oxides of elements include silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La). In particular, the added metal oxides or nitrogen oxides are more preferably uniformly dispersed in a nano-phase so as to control the dislocation density present in the single crystal nitride semiconductor.

Also, the elements that are added to the SDPL including boron nitride (B—N), silicon carbide (Si—C), or silicon carbon nitride (Si—C—N) as a matrix, are preferably present in an amount of 0.1 to 49 wt %.

Preferably, the SDPL is formed with a thickness of 3 nanometers to 10 micrometers.

Preferably, the SDPL is formed using at least one of various physical vapor deposition methods such as CVD (Chemical Vapor Deposition) including MOCVD; thermal or E-beam evaporation; laser deposition using a high energy; sputtering deposition using gas ions such as oxygen ($O_2$), nitrogen ($N_2$), and argon (Ar); and co-sputtering deposition using at least two sputtering guns.

More preferably, the formation of the SDPL is carried out in a temperature range of a room temperature to 1200 degrees Celsius amongst the various processes for depositing a substrate decomposition prevention layer onto the conductive substrate using the various methods.

As described above, the present invention may be useful to allow a single crystal nitride semiconductor material to grow on zinc oxide (ZnO) which is a conductive substrate and manufacture a nitride light-emitting device using the growth of the single crystal nitride semiconductor material. More specifically, a superior single crystal nitride semiconductor may be allowed to grow on conductive substrates including a transparent conductive zinc oxide (ZnO) substrate by introducing boron nitride (B—N), silicon carbide (Si—C), or silicon carbon nitride (Si—C—N), which have thickness of at least 3 nanometers, as an SDPL for preventing deformation and decomposition of a substrate at a high temperature and a hydrogen ambient, and a novel high-quality nitride light-emitting device may be manufactured using the growth of the single crystal nitride semiconductor material, the novel high-quality nitride light-emitting device having excellent luminous efficiency, a low operating voltage, and excellent heat spreading ability, as well as a large area and high performance.

The invention claimed is:

1. A light-emitting device comprising:
a substrate decomposition prevention layer using, as a matrix, at least one selected from the group consisting of boron nitride (B—N), silicon carbide (Si—C), and silicon carbon nitride (Si—C—N), and patterned into a predetermined shape;
an n-type nitride clad layer formed on the substrate decomposition prevention layer;
a nitride active layer formed on the n-type nitride clad layer;
a p-type nitride clad layer formed on the nitride active layer;
a p-type ohmic contact layer formed on the p-type nitride clad layer;
a p-type electrode pad formed on the p-type ohmic contact layer;
an n-type ohmic contact layer electrically connected to the n-type nitride clad layer by means of a patterned region of the substrate decomposition prevention layer; and
an n-type electrode pad formed beneath the n-type ohmic contact layer.

2. The light-emitting device of claim 1, further comprising a nitride buffer layer formed between the substrate decomposition prevention layer and the n-type nitride clad layer.

3. The light-emitting device of claim 1, wherein the p-type ohmic contact layer includes at least one selected from the group consisting of transparent conductive oxides using ITO, ZnO, $SnO_2$, and $In_2O_3$ as a matrix; conductive transitional metal nitrides including TiN; and oxidized nickel-gold (Ni—Au) and silver (Ag).

4. The light-emitting device of claim 3, wherein the p-type electrode pad is composed of a bi-layer of nickel (Ni) and gold (Au) or a bi-layer of silver (Ag) and gold (Au).

5. The light-emitting device of claim 4, wherein the n-type ohmic contact layer is composed of a bi-layer of aluminum and titanium (Al/Ti).

6. The light-emitting device of claim 5, wherein the n-type electrode pad includes at least one selected from the group consisting of aluminum (Al), silver (Ag), and rhodium (Rh).

7. The light-emitting device of claim 1, wherein the n-type ohmic contact layer includes at least one selected from the group consisting of transparent conductive oxides using ITO, ZnO, $SnO_2$, and $In_2O_3$ as a matrix; conductive transitional metal nitrides including TiN; and oxidized nickel-gold (Ni—Au) and silver (Ag).

8. The light-emitting device of claim 7, wherein the n-type electrode pad is composed of a bi-layer of nickel (Ni) and gold (Au) or a bi-layer of silver (Ag) and gold (Au).

9. The light-emitting device of claim 8, wherein the p-type ohmic contact layer is composed of a bi-layer of aluminum and titanium (Al/Ti).

10. The light-emitting device of claim 9, wherein the p-type electrode pad includes at least one selected from the group consisting of aluminum (Al), silver (Ag), and rhodium (Rh).

11. The light-emitting device of claim 1, wherein the substrate decomposition prevention layer includes at least one additive selected from the group consisting of oxides or nitrogen oxides of elements including silicon (Si), germanium (Ge), indium (In), lithium (Li), gallium (Ga), magnesium (Mg), zinc (Zn), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn), titanium (Ti), tantalum (Ta), chromium (Cr), and lanthanum (La).

12. The light-emitting device of claim 11, wherein an amount of the additive in the substrate decomposition prevention layer ranges from 0.1 wt % to 49 wt %.

13. The light-emitting device of claim 12, wherein the substrate decomposition prevention layer has a thickness of 3 nanometers to 10 micrometers.

14. The light-emitting device of claim 13, wherein the substrate decomposition prevention layer includes a bi-layer of a lower layer and an upper layer, the lower layer including boron nitride (B—N), silicon carbide (Si—C), or silicon carbon nitride (Si—C—N) as a matrix, and the upper layer being composed of silicon carbide (SiC).

15. A light-emitting device comprising:
a supporting substrate;
a p-type ohmic contact layer formed on the supporting substrate and reflecting the light;
a p-type nitride clad layer formed on the p-type ohmic contact layer;
a nitride active layer formed on the p-type nitride clad layer;
an n-type nitride clad layer formed on the nitride active layer;
a transparent n-type ohmic contact layer formed on the n-type nitride clad layer; and,
an n-type electrode pad formed on the n-type ohmic contact layer,
wherein the transparent n-type ohmic contact layer includes at least one selected from the group consisting of transparent conductive oxides made of at least one of ITO, ZnO, $SnO_2$, and $In_2O_3$; conductive transitional metal nitrides including TiN; and oxidized nickel-gold (Ni—Au) and silver (Ag), and
wherein the n-type electrode pad is a bi-layer consisting of nickel (Ni) layer and gold (Au) layer or a bi-layer consisting of a silver (Ag) layer and a gold (Au) layer.

16. The light-emitting device of claim 15, wherein the n-type ohmic contact layer is composed of a bi-layer of aluminum and titanium (Al/Ti).

* * * * *